United States Patent [19]
Kim

[11] Patent Number: 6,090,654
[45] Date of Patent: Jul. 18, 2000

[54] METHOD FOR MANUFACTURING A STATIC RANDOM ACCESS MEMORY CELL

[75] Inventor: Jae-Kap Kim, Kyoungki-do, Rep. of Korea

[73] Assignee: Hyundai Electronics Industries Co. Ltd., Kyoungki-do, Rep. of Korea

[21] Appl. No.: 08/883,196

[22] Filed: Jun. 26, 1997

[30] Foreign Application Priority Data

Jun. 29, 1996 [KR] Rep. of Korea ................. 96-26295

[51] Int. Cl.[7] .............................. H01L 21/8234
[52] U.S. Cl. ................. 438/238; 438/241; 438/953; 438/152; 438/153
[58] Field of Search .................. 438/238, 241, 438/953, 152, 153

[56] References Cited

U.S. PATENT DOCUMENTS

| | | | |
|---|---|---|---|
| 5,324,973 | 6/1994 | Sivan | 257/330 |
| 5,955,746 | 9/1999 | Kim | 257/69 |

FOREIGN PATENT DOCUMENTS

| | | |
|---|---|---|
| 1-287960 | 11/1989 | Japan . |
| 1-292853 | 11/1989 | Japan . |
| 1-298761 | 12/1989 | Japan . |
| 3-94464 | 4/1991 | Japan . |
| 7-22521 | 1/1995 | Japan . |

OTHER PUBLICATIONS

Patent Abstracts of Japan, Publication No. 07022521 (Jan. 24, 1995).
English translation of Purpose and Constitution of Japanese No. 1–298761 (Dec. 1, 1989).
English translation of Purpose and Constitution of Japanese No. 3–94464 (Apr. 19, 1991).
English translation of Purpose and Constitution of Japanese Application No. 1–292853 (Nov. 27, 1989).
English translation of Purpose and Constitution of Japanese Application No. 1–287960 (Nov. 20, 1989).

*Primary Examiner*—John F. Niebling
*Assistant Examiner*—Lynne A. Gurley

[57] ABSTRACT

Disclosed is a semiconductor device having an enhanced current amount ratio, and a manufacturing method thereof. The semiconductor device includes a first transistor and a second transistor. There is a selective electric current capacity difference between the first transistor and the second transistor, wherein a gate degeneracy of the first transistor is different from a gate degeneracy of the second transistor. Among the first and second transistors, the gate degeneracy of the transistor requiring a small amount of current is higher than the gate degeneracy of the transistor requiring a large amount of current.

12 Claims, 4 Drawing Sheets

METHOD FOR MANUFACTURING A STATIC RANDOM ACCESS MEMORY CELL

BACKGROUND OF THE INVENTION

1. Field of the Invention

The present invention relates to a semiconductor device and a manufacturing method thereof, and more particularly to a static random access memory cell having an enhanced cell ratio, and a manufacturing method thereof.

2. Description of the Prior Art

Generally, a Static Random Access Memory (SRAM) has characteristics of high speed, low power consumption, and simple operation, and a SRAM memory cell usually consists of a flip-flop circuit. In addition, unlike a DRAM, the SRAM has advantages of an easy design as well as not having to regularly refresh stored data. In general, the SRAM cell includes: two pull-up transistors; two access transistors; and two pull-down transistors. The SRAM cell is further classified as the following: a full CMOS cell; a high road resistor(HRL) cell; and a thin film transistor (TFT) cell in accordance with the load type of the pull-up transistors.

The TFT cell is a memory cell wherein a P channel polysilicon TFT is used as a load transistor. A SRAM with TFT cell is developed for a 4 Mb or a 16 Mb SRAM cell. Compared to a SRAM with HRL cell, the SRAM with TFT cell has lower standby power consumption and has excellent stability. In addition, compared to a SRAM with the full CMOS cell having a bulk structure, the SRAM with the TFT cell has an excellent degree of high integration. However, the manufacturing process of the SRAM with the TFT cell is complex. Accordingly, the SRAM with the full CMOS cell having the bulk structure is manufactured and utilized to a higher degree. In contrast to the SRAM with the TFT cell, the SRAM with the full CMOS cell can be fabricated with a simple process. In addition, the SRAM with the full CMOS cell is possible to obtain a high current during its operation.

FIG. 1 illustrates a circuit diagram of a SRAM cell with the full CMOS cell.

Referring to FIG. 1, reference numerals WL denotes a word line, BL1 and BL2 denote bit lines, N1 and N2 denote nodes, VDD denotes a power supply voltage, and VSS denotes a ground voltage respectively. Reference numerals UT1 and UT2 denote P channel MOS(PMOS) transistors for use in pull-up devices, DT1 and DT2 denote N chanel MOS(NMOS) transistors for use in pull-down devices, and AT1 and AT2 denote NMOS transistors for use in access devices, respectively.

A first CMOS inverter is consisted of the PMOS transistor UT1 for use in pull-up device and the NMOS transistor DT1 for use in pull-down. A second CMOS inverter is consisted of the PMOS transistor UT2 for use in pull-up device and the NMOS transistor DT2 for use in pull-down device. At the cell node N1, the output of the first CMOS inverter and the input of the second CMOS inverter are connected to each other. At the cell node N2, the input of the first CMOS inverter and the output of the second CMOS inverter are connected to each other. The sources of the NMOS transistor AT1 and AT2 for use in access devices are respectively connected to the bit line BL1 and BL2. The drains of the NMOS transistor AT1 and AT2 for use in access devices are respectively connected to the cell node N1 and N2. The gates of the NMOS transistor AT1 and AT2 for use in access devices are connected to the word line WL.

In the SRAM cell having the above described structure, in order to store data at a HIGH state in the cell node N1 and data at a LOW state in the cell node N2, the NMOS transistors AT1 and AT2 are turned by turning on the word line WL. Data at a HIGH state is inputted to the bit line BL1 and data at a LOW state is inputted to the bit line BL2, so that the PMOS transistor UT1 and the NMOS transistor DT2 are turned on, and the PMOS transistor UT2 and the NMOS transistor DT1 are turned off. As a result, the cell node N1 becomes a HIGH state and the cell node N2 becomes a LOW state. Furthermore, although the word line WL is turned off, the cell node N1 is maintained at a HIGH state, the cell node N2 is maintained at a LOW state, by latch. Accordingly, data is stored in the cell node N1 and N2 respectively.

Meanwhile, one of the factors determining the characteristics of the SRAM is the current driving capability ratio of the pull-down device, otherwise known as the driving device, and the access device ($I_{DSAT\ DRIVER\ TRANSISTOR}/I_{DSAT\ ACCESS\ TRANSISTOR}$), otherwise known as cell ratio. A higher cell ratio results in improved performance of the SRAM. Therefore when the current amount of the pull-down device is larger and the current amount access device is small, the performance of the SRAM cell is improved.

Hereinbelow, the operation of the SRAM cell in relation to the cell ratio will be described with reference to FIG. 1. In case data at a LOW state is stored in the cell node N1 and data at a HIGH state is stored in the cell node N2, the voltage of the cell node N1 is determined by the current amount ratio of the NMOS transistors AT1 and AT2 for use in access devices and the NMOS transistors DT1 and DT2 for use in pull-down devices. Accordingly, when the current amount of the NMOS transistors DT1 and DT2 for use in pull-down devices is increased and the current amount of the NMOS transistors AT1 and AT2 for use in access devices is decreased, the voltage of the cell node N1 is intended to maintain the low voltage. Then, when the NMOS transistors AT1 and AT2 for use in access devices are turned on during a reading operation, the voltage of the cell node N1 does not considerably change at the LOW state regardless of the variation of the voltage of the bit line BL1. If the variation of the voltage of the cell node N1 is small, the voltage of the cross-coupled cell node N2 is maintained at the HIGH state.

Accordingly, in the conventional SRAM cell, the cell ratio is controlled in a manner wherein width of transistor for use in the access device is reduced and its length is increased to thereby reduce its the current amount. In addition, the width of the transistor for use in pull-down device is increased and its length is reduced to thereby increase its the current amount. However, it is impossible to reduce the width and the length of the transistor beyond a predetermined point. Accordingly, there is a limit in relation to the reduction of the cell size for enhancing cell ratio.

SUMMARY OF THE INVENTION

The present invention is provided to solve the foregoing problems. Accordingly, it is a first object of the present invention to provide a semiconductor device capable of enhancing an current amount ratio of an access device to a pull-down device of the SRAM cell by creating a difference between a gate degeneracy of the access device and a gate degeneracy of the pull-down device.

It is a second object of the present invention to provide a SRAM cell having enhanced cell ratio.

It is a third object of the present invention to provide a manufacturing method of a semiconductor device capable of enhancing a current amount ratio of an access device to a pull-down device of the SRAM by creating a difference between a gate degeneracy of the access device and a gate degeneracy of the pull-down device.

It is a fourth object of the present invention to provide a manufacturing method of a SRAM cell having an enhanced cell ratio.

In order to achieve the above first object, the present invention provides a semiconductor device comprising a first transistor and a second transistor. In the semiconductor device, there is a selective current amount difference between the first transistor and the second transistor. Furthermore, a gate degeneracy of the first transistor is different from a gate degeneracy of the second transistor. The gate degeneracy of the transistor requiring a small amount of current is higher than the gate degeneracy of the transistor requiring a large amount of current.

In order to achieve the above second object, the present invention provides a static random access memory cell comprising a pull-up device, a pull-down device and an access device. In the static random access memory cell, a gate degeneracy of the pull-down device is higher than a gate degeneracy of the access device.

In order to achieve the above third object, the present invention provides a method of manufacturing a semiconductor device, comprising the steps of: providing a semiconductor substrate on which an active region of a first and a second transistor of a predetermined conductivity type are defined, wherein there is a selective current amount difference between the first transistor and the second transistor; forming a gate insulating film and a gate material layer on the substrate in sequence; doping impurities having a conductivity type which is the same as the predetermined conductivity type into the gate material layer on the active region of the first transistor; patterning the gate material layer to form an impurity doped first gate of the first transistor and a second gate of the second transistor, the second gate not being doped; forming low concentration impurity regions of the first transistor and the second transistor by implanting impurity ions into the substrate, the impurity ions having a conductivity type which is the same as the conductivity type of the substrate; forming insulating spacers at both the walls of the first gate and the second gate; and forming high concentration impurity regions of the first transistor and the second transistor by implanting impurity ions into the substrate, the impurity ions having a conductivity type which is the same as the conductivity type as the substrate.

In order to achieve the above fourth object, the present invention provides a method of manufacturing a static random access memory cell including a pull-up device, a pull-down device and an access device, comprising the steps of: providing a semiconductor substrate on which active regions of said pull-down device and said access device are defined; forming a gate insulating film and a gate material layer on the substrate in sequence; doping impurities into the gate material layer on the active region of the pull-down device; patterning the gate material layer to form gates of the pull-down device and a gate of the access device, respectively; forming source and drain regions of low concentration of the pull-down device and the access device by implanting low concentration impurities into the substrate; forming insulating spacers at both side walls of the gates; and forming source and drain regions of high concentration of the pull-down device and the access device by implanting high concentration impurities into the substrate.

BRIEF DESCRIPTION OF THE DRAWINGS

The above object and other characteristics and advantages of the present invention will become more apparent by describing in detail a preferred embodiment thereof with reference to the attached drawings, wherein.

DETAILED DESCRIPTION OF THE INVENTION

Hereinafter, the preferred embodiment of the present invention will be explained in more detail with reference to the accompanying drawings.

Figure 1:
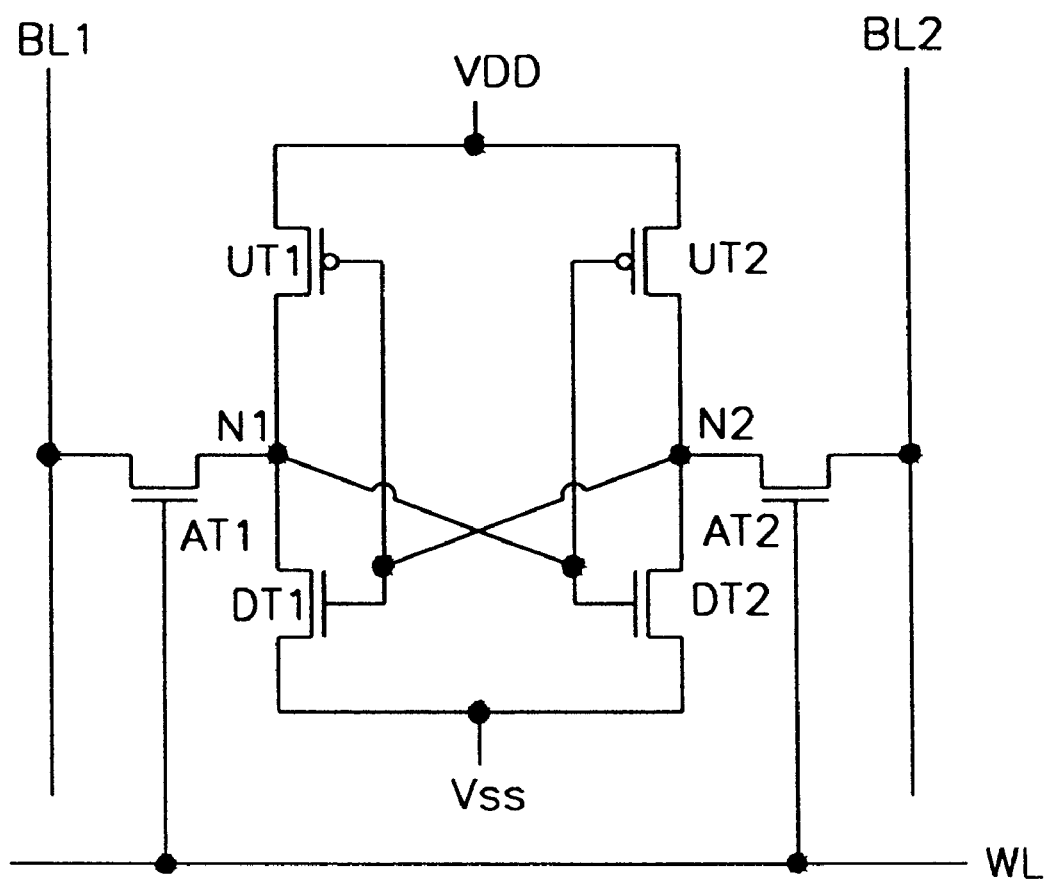
FIG. 1 illustrates a circuit diagram of a SRAM cell with a full CMOS cell.
Figure 2:
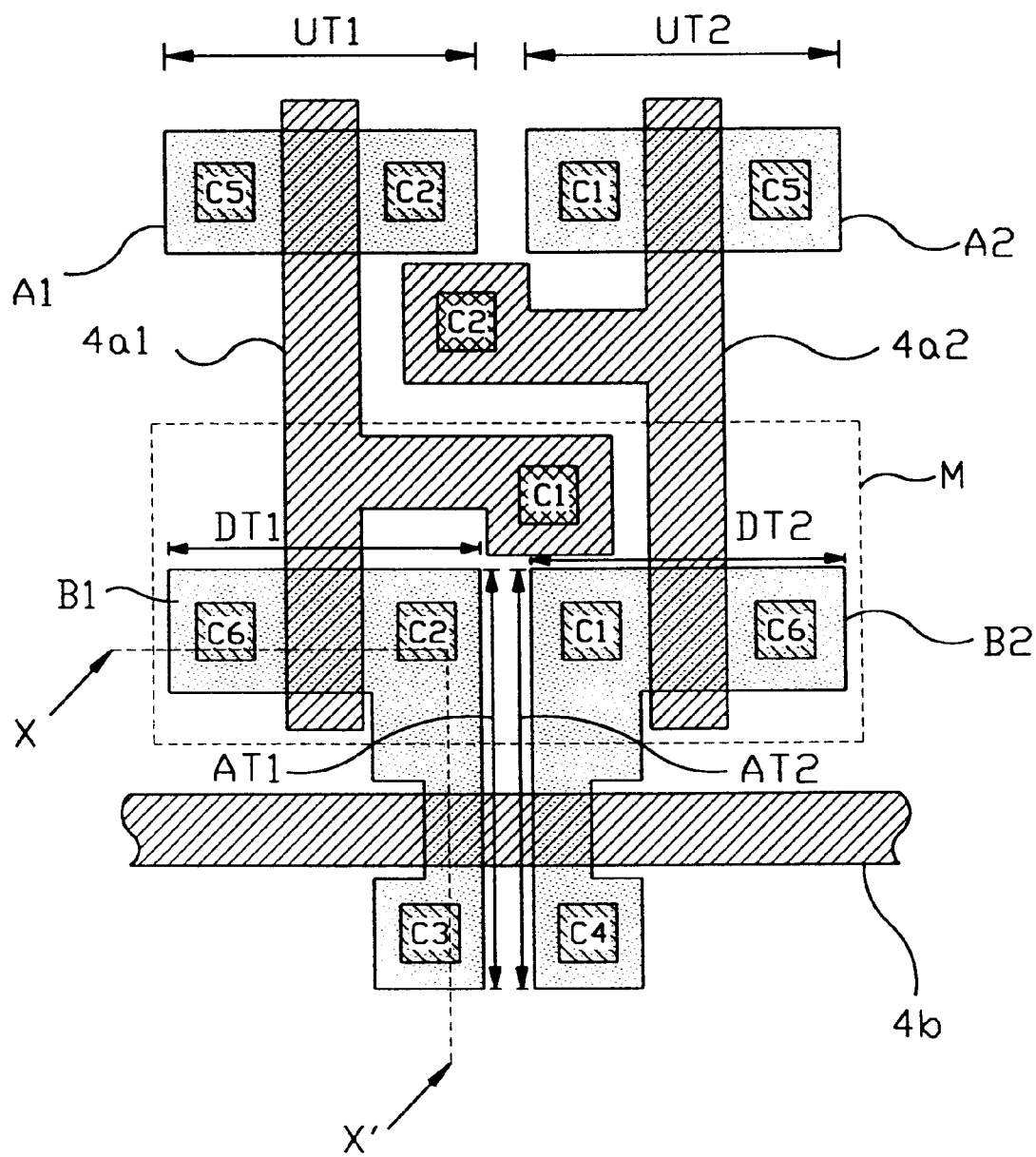
FIG. 2 is a plan view of a SRAM cell according to a preferred embodiment of the present invention.

FIG. 2 is a plan view of a SRAM cell according to a preferred embodiment of the present invention, showing the circuit diagram of the SRAM cell with the full CMOS cell illustrated in FIG. 1.

Referring to FIG. 2, reference numerals A1 and A2 denote active regions of PMOS transistors UT1 and UT2 for use in pull-up devices. Reference numerals B1 and B2 denote active regions of the NNOS transistors DT1 and DT2 for use in pull-down devices and the NMOS transistors AT1 and AT2 for use in access devices. Reference numerals 4a1 and 4a2 denote gates (word line) of the PMOS transistors UT1 and UT2 for use in pull-up devices and the NNOS transistors DT1 and DT2 for use in pull-down devices. Reference numeral 4b denote a gate(word line) of the NMOS transistor AT1 and AT2 for use in access devices. Reference numerals C1 to C6 denote contact areas. That is, reference numerals C1 and C2 denote contact areas of the cell nodes N1 and N2, and reference numerals C3 and C4 denote source contact areas of the NMOS transistors AT1 and AT2 for use in access devices. Furthermore, reference numerals C5 denote source contact areas of the PMOS transistors UT1 and UT2 for use in pull-up devices, and reference numerals C6 denote source contact areas of the NMOS transistors DT1 and DT2 for use in pull-down devices. Reference numeral M represents an ion implantation mask pattern for forming the N-type gate. In the ion implantation mask pattern M, regions of the NMOS transistor DT1 and DT2 for use in pull-down devices among the NMOS transistors UT1, UT2, AT1 and AT2 are only exposed.

Meanwhile, although FIG. 2 illustrates the SRAM cell with the full CMOS cell, it can be used for showing a SRAM cell with HRL cell and a SRAM cell with P channel polysilicon TFT.

FIGS. 3A to 3E are sectional views taken along line X—X' illustrated in FIG. 2, showing a manufacturing method of the SRAM cell according to the preferred embodiment of the present invention.

Figure 3A:
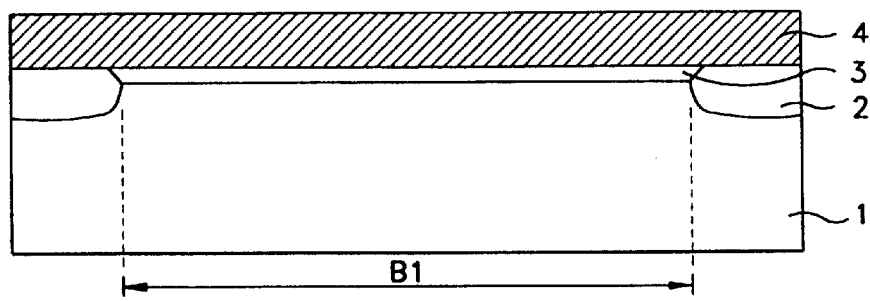
FIGS. 3A to 3E illustrate a manufacturing method of the SRAM cell according to the preferred embodiment of the present invention.

As shown in FIG. 3A, field oxidation layers 2 are formed on a predetermined portion of a semiconductor substrate 1 by using LOCOS (LOCal Oxidation of Silicon). Thus, it is possible to obtain an active region B1 of the MOS transistor DT1 for use in pull-down device and the NMOS transistor AT1 for use in access device. A gate oxidation film 3 having a thickness about 70 Å is formed on the substrate 1 between the field oxidation layers 2. Then, a gate material layer 4 having a thickness of approximately 1,500–3,000 Å is formed on the substrate 1. Preferably, the gate material comprises an amorphous silicon or a polysilicon.

Figure 3B:
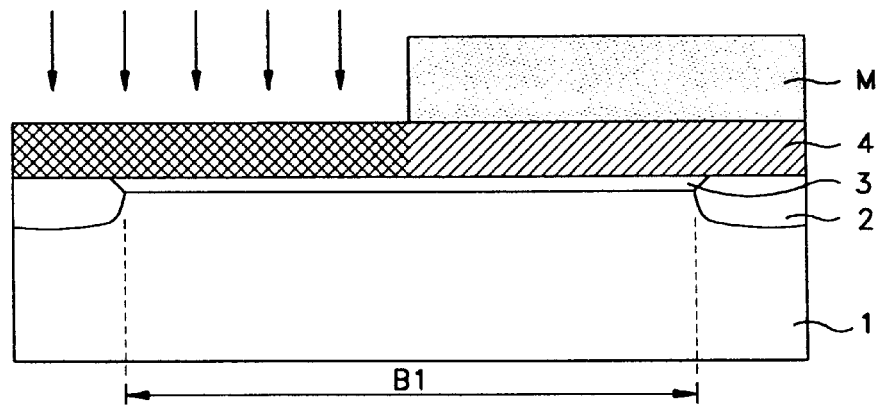

As shown in FIG. 3B, the mask pattern M (referred to FIG. 2) is formed on the gate material layer 4 by exposing a predetermined region of the NMOS transistor for use in pull-down device by means of the photolithography, and by masking a predetermined region of the NMOS transistor for use in access device. N-type impurity ions, preferably, P ions are implanted into the gate material layer 4 which is exposed by performing ion implantation process using the mask pattern M. The ion implantation process is performed at the concentration of $1 \times 10^{15}$ ions/cm$^2$ to $1 \times 10^{16}$ ions/cm$^2$ and at an energy of approximately 20 KeV to 120 KeV.

Figure 3C:
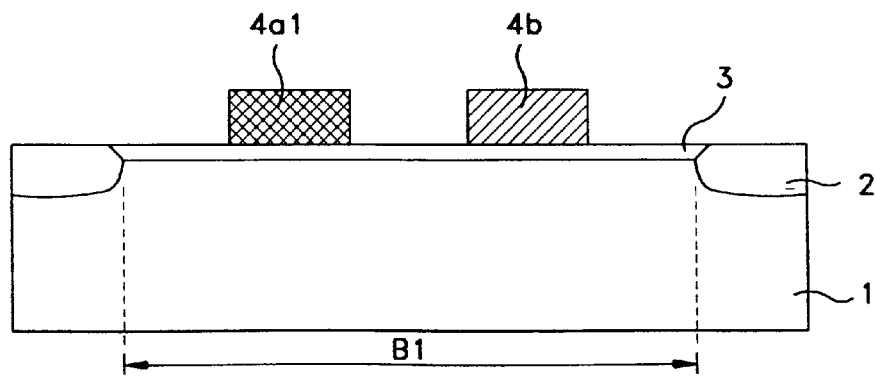

As shown in FIG. 3C, the mask pattern M is removed and the gate material layer 4 is patterned, so that the gate 4a1 of the NMOS transistor DT1 for use in pull-down device and the gate 4b of the NMOS transistor AT1 for use in access device are formed.

Figure 3D:
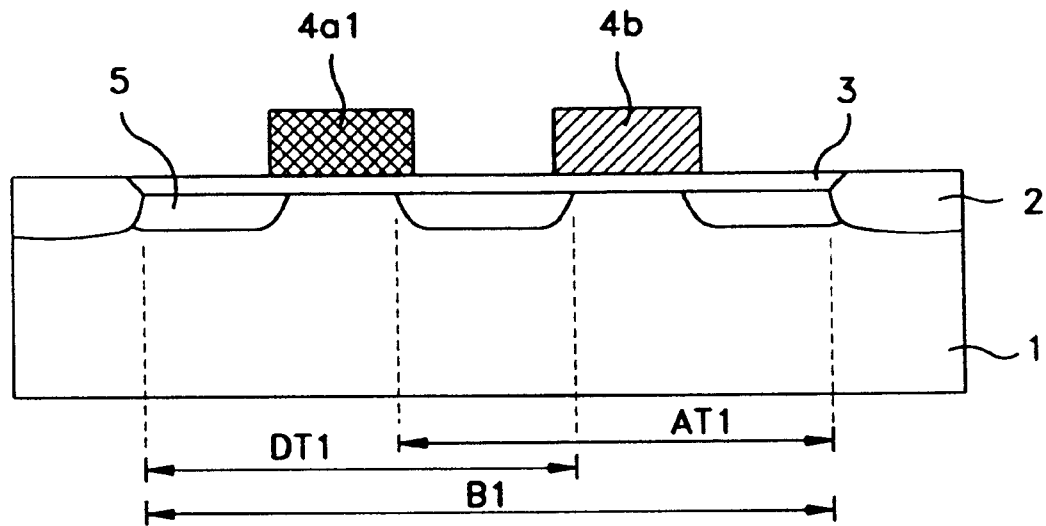

As shown in FIG. 3D, N$^-$ impurity ions are implanted into the substrate 1 by performing the ion implantation process, so that N$^-$ impurity diffusion regions 5 are formed.

Figure 3E:
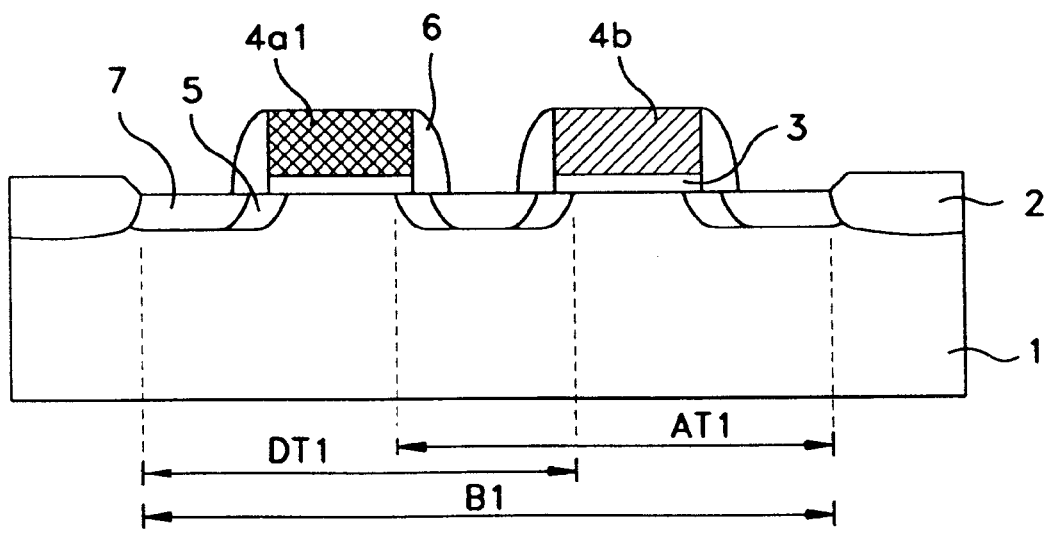

As shown in FIG. 3E, an insulating layer is formed on the structure shown in FIG. 3D. The insulating layer is then etched by using the anisotropic blanket etching. As a result, the surfaces of the gate 4a1 and 4b are exposed and insulating film spacers 6 for use in forming LDD regions are formed at both side walls of the gate 4a1 and 4b. Thereafter, N$^+$ impurity ions, preferably, As ions are implanted into the substrate 1 by performing the ion implantation process, and then the substrate 1 is annealed. At this time, the ion implantation process is performed at a concentration of approximately $1 \times 10^{15}$ ions/cm$^2$ to $1 \times 10^{16}$ ions/cm$^2$ and at an energy of approximately 10 KeV to 100 KeV. As a result, N$^+$ impurity diffusion regions 7 of the NMOS transistor DT1 for use in pull-down device and the NMOS transistor AT1 for use in access device are formed. Thus, a LDD structure is accomplished. Meanwhile, the Nt impurity is also implanted into the gates 4a1 and 4b during the implantation of the ion.

In the above embodiment according to the present invention, the P ions and the As ions are doped into the gate 4a1 of the NMOS transistor DT1 for use in pull-down device. As a result, the degeneracy of the gate 4a1 is about 85% to 90%. Furthermore, the As ions are only doped into the gate 4b of the NMOS transistor AT1 for use in access device. As a result, the degeneracy of the gate 4b is about 80% to 85%.

When the P ions are doped into the gate 4a1 of the NMOS transistor DT1 for use in pull-down device at a concentration of $2 \times 10^{15}$ ions/cm$^2$ and at an energy of 30 KeV to 70 KeV and the As ions are doped into the gate 4a1 of the NMOS transistor DT1 for use in pull-down device at a concentration of $2 \times 10^{15}$ ions/cm$^2$ and an energy of 80 KeV, the thickness of the electric gate oxidation film increases to about 73 Å in the inversion mode of the NMOS transistor DT1 for use in pull-down device. In other words, if a positive bias is applied to the gate 4al, the P ions and the As ions doped into the gate 4a1 are depleted at the interface of the gate oxidation film, whereby the thickness of the electric gate oxidation film is increased.

Meanwhile, when the As ion is only doped into the gate 4b of the NMOS transistor AT1 for use in access device at a concentration of $2 \times 10^{15}$ ions/cm$^2$ and at an energy of 80 KeV, the thickness of the electric gate oxidation film of the access NMOS transistor AT1 is increased to about 120 Å. In other words, if a positive bias is applied to the gate 4b, the As ion doped into the gate 4b is depleted at the interface of the gate oxidation film, thereby the thickness of the electric gate oxidation film of the NMOS transistor AT1 for use in access device is increased to a greater degree than the thickness of the electric gate oxidation film of the NMOS transistor DT1 for use in pull-down device.

Consequently, the current amount of the NMOS transistor for use in access device decreases in relation to the current amount of the NMOS transistor for use in pull-down due to the degeneracy difference of the gate according to the doping of the impurities. Accordingly, the cell ratio of the SRAM cell is enhanced.

In addition, the cell ratio of the SRAM cell is enhanced by using the degeneracy difference of the gate without controlling the width and the length of the transistor. As a result, high integration of the device can be accomplished.

Meanwhile, in the above embodiment according to the present invention, the SRAM cell having the current amount difference between the access device and the pull-down device is described. However, the present invention can be applied to a semiconductor device requiring the selective current amount difference.

As described, according to the present invention, in the device requiring the difference of the selective current amount, the current amount ratio of the two devices is enhanced by using the degeneracy difference of the gate of the two devices.

While the present invention has been particularly shown and described with reference to a particular embodiment thereof, it will be understood by those skilled in the art that various changes in form and detail may be effected therein without departing from the spirit and scope of the invention as defined by the appended claims.

What is claimed is:

1. A method of manufacturing a static random access memory cell including a pull-up device, a pull-down device and an access device, comprising the steps of:

providing a semiconductor substrate on which active regions of said pull-down device and said access device are defined;

forming a gate insulating film and a gate material layer on said substrate in sequence;

doping impurities into said gate material layer on the active region of said pull-down device;

patterning said gate material layer to form a gate of the pull-down device and a gate of the access device, respectively;

doping the gate of the pull-down device with P ions and Arsenic (As) ions; and doping the gate of the access device with Arsenic (As) ions.

2. The method of manufacturing a static random access memory cell as claimed as in claim 1, wherein said gate material comprises a polysilicon.

3. The method of manufacturing a static random access memory cell as claimed as in claim 2, wherein said polysilicon has a thickness of 1,5000 Å to 3,000 Å.

4. The method of manufacturing a static random access s memory cell as claimed as in claim 1, wherein said gate material comprises an amorphous silicon.

5. The method of manufacturing a static random access memory cell as claimed as in claim 4, wherein said amorphous silicon has a thickness of 1,5000 Å to 3,000 Å.

6. The method of manufacturing a static random access memory cell as claimed in claim 1, wherein said step doping impurities, comprises ion implanting P ions into said substrate at a concentration of $1 \times 10^{15}$ ions/cm$^2$ to $1 \times 10^{16}$ ions/cm$^2$ and at an energy of 20 KeV to 120 KeV.

7. The method of manufacturing a static random access memory cell as claimed in claim 1, further comprising the steps of:

forming source and drain regions of low concentration of said pull-down device and said access device by implanting low concentration impurities into said substrate;

forming insulating spacers at both side walls of said gates; and forming source and drain regions of high concentration of said pull-down device and said access device by implanting high concentration impurities into said substrate.

8. The method of manufacturing a static random access memory cell as claimed in claim 7, wherein in said step forming source and drains of high concentration, said gates are degeneraced by doping the impurities into said gates.

9. The method of manufacturing a static random access memory cell as claimed in claim 7, wherein said step forming source and drain of high concentration, comprises ion implanting As ions into said substrate at a concentration of $1 \times 10^{15}$ ions/cm$^2$ to $1 \times 10^{16}$ ions/cm$^2$ and at an energy of 10 KeV to 100 KeV.

10. The method of manufacturing a static random access memory cell as claimed in claim 1, wherein said pull-up device comprises a P channel bulk MOSFET.

11. The method of manufacturing a static random access memory cell as claimed in claim 1, wherein said pull-up device comprises a high road resistor.

12. The method of manufacturing a static random access memory cell as claimed in claim 1, wherein said pull-up device comprises a P channel polysilicon TFT.

* * * * *

UNITED STATES PATENT AND TRADEMARK OFFICE
CERTIFICATE OF CORRECTION

PATENT NO : 6,090,654
DATED : July 18, 2000
INVENTOR(S): J. Kim

It is certified that error appears in the above-identified patent and that said Letters Patent are hereby corrected as shown below:

At col. 4, line 58, cancel "MOS" and substitute --NMOS--.

At col. 5, line 33, cancel "Nt" and substitute --$N^+$--; and at line 54, cancel "4a1" and substitute --4a1--.

At col. 6, line 53 (claim 3, line 3), cancel "1,5000 Å" and substitute --1,500 Å--; and at line 59 (claim 5, line 3), cancel "1,5000 Å" and substitute --1,500 Å--.

Signed and Sealed this

Seventeenth Day of April, 2001

*Attest:*

NICHOLAS P. GODICI

*Attesting Officer*   *Acting Director of the United States Patent and Trademark Office*